United States Patent
Andry et al.

(10) Patent No.: US 10,056,337 B2
(45) Date of Patent: Aug. 21, 2018

(54) THIN 3D DIE WITH ELECTROMAGNETIC RADIATION BLOCKING ENCAPSULATION

(71) Applicants: International Business Machines Corporation, Armonk, NY (US); Johnson & Johnson Vision Care, Inc., Jacksonville, FL (US)

(72) Inventors: Paul S. Andry, Westchester, NY (US); Cornelia K. Tsang, Mohegan Lake, NY (US); Adam Toner, St. Johns, FL (US)

(73) Assignees: International Business Machines Corporation, Armonk, NY (US); JOHNSON & JOHNSON VISION CARE, INC., Jacksonville, FL (US)

( * ) Notice: Subject to any disclaimer, the term of this patent is extended or adjusted under 35 U.S.C. 154(b) by 0 days.

(21) Appl. No.: 15/412,479

(22) Filed: Jan. 23, 2017

(65) Prior Publication Data

US 2018/0211924 A1    Jul. 26, 2018

(51) Int. Cl.
*H01L 23/552* (2006.01)
*H01L 23/522* (2006.01)
*H01L 23/00* (2006.01)

(52) U.S. Cl.
CPC ........ *H01L 23/552* (2013.01); *H01L 23/5226* (2013.01); *H01L 24/05* (2013.01); *H01L 24/13* (2013.01); *H01L 2224/0401* (2013.01); *H01L 2224/05025* (2013.01); *H01L 2224/10126* (2013.01); *H01L 2224/13026* (2013.01); *H01L 2924/3025* (2013.01)

(58) Field of Classification Search
CPC ... H01L 23/5226; H01L 23/552; H01L 23/66; H01L 24/05; H01L 24/13
See application file for complete search history.

(56) References Cited

U.S. PATENT DOCUMENTS

2014/0225236 A1*  8/2014  Kim ..................... H01L 23/552
                                                        257/659

* cited by examiner

*Primary Examiner* — Cuong Q Nguyen
(74) *Attorney, Agent, or Firm* — Scully, Scott, Murphy & Presser, P.C.; Louis J. Percello, Esq.

(57) ABSTRACT

After forming a first electromagnetic radiation blocking layer over a front side of a device wafer, the device wafer is bonded to a handle substrate from the front side. A semiconductor substrate in the device wafer is thinned from its backside. Trenches are formed extending through the device wafer and the first electromagnetic radiation blocking layer such that the device wafer is singulated into semiconductor dies. A second electromagnetic radiation blocking layer portion is formed on a backside surface of and sidewalls surfaces of each of the semiconductor dies such that each of the semiconductor dies are fully encapsulated by the first and second electromagnetic radiation blocking layer portions.

11 Claims, 17 Drawing Sheets

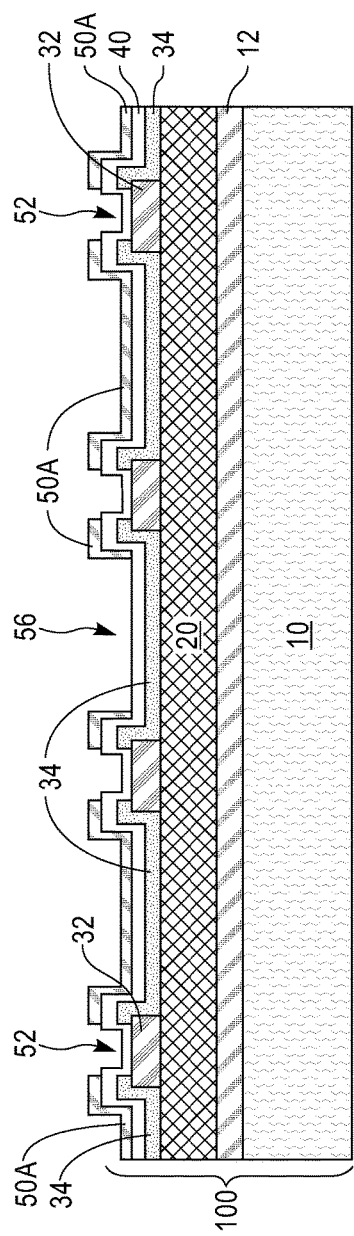
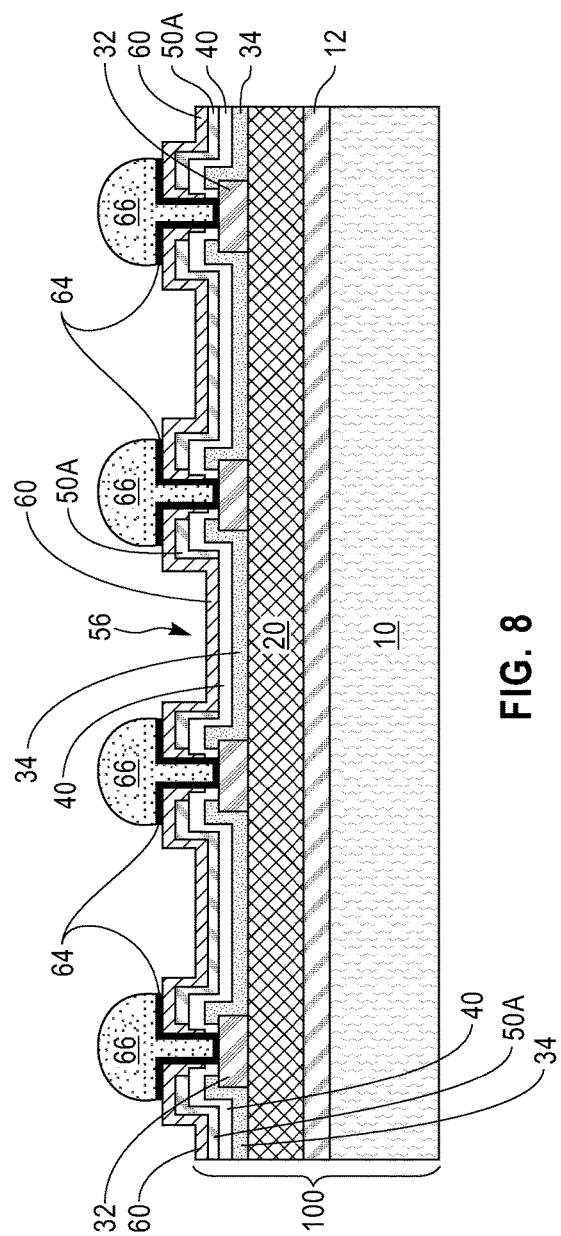
FIG. 7
FIG. 8

THIN 3D DIE WITH ELECTROMAGNETIC RADIATION BLOCKING ENCAPSULATION

BACKGROUND

The present application relates to semiconductor fabrication, and more particularly to the fabrication of semiconductor dies with electromagnetic radiation blocking components.

New classes of low-profile miniaturized microsystems are being developed for a myriad of new applications; some of which require semiconductor dies having dimensions on the order of 100 µm or less. While the technologies for creating such small and thin semiconductor dies are well-established, techniques required to make these semiconductor dies immune to electromagnetic radiation such as ultraviolet (UV), visible and infrared (IR) light, without the need for additional packaging, are still lacking. Considering an application with two types of semiconductor dies in which the semiconductor die of the first type contains a light sensor on a portion of its surface, and the semiconductor die of the second type contains charge pumps to drive an analog output voltage signal to an actuator, it has been found that the bare die of the first type experiences an unwanted shift in oscillator frequency when it is illuminated, while the bare die of the second type experiences a dramatic drop in output voltage signal. These effects are both caused by generation of minority carriers in the exposed semiconductor body of the dies. Adding an electromagnetic radiation blocking layer to the top circuit side only protects the semiconductor dies from topside illumination, but scattered light can still reach the sides and backsides of the semiconductor dies, creating the same spurious effects. Adding an opaque electromagnetic radiation blocking layer surrounding the semiconductor dies at die level is not practical, especially for profile-sensitive applications since there is no room to add any external package at all. Furthermore, for very small semiconductor dies, it is very inconvenient, and in certain cases is highly unprofitable, to add an opaque electromagnetic radiation blocking layer at the die level. Therefore, there remains a need for a method that allows for fully encapsulating semiconductor dies with electromagnetic radiation blocking components at the wafer level.

SUMMARY

The present application provides a method that allows for fully encapsulating semiconductor dies with electromagnetic radiation blocking components at the wafer level. After forming a first electromagnetic radiation blocking layer over a front side of a device wafer, the device wafer is bonded to a handle substrate from the front side. A semiconductor substrate in the device wafer is thinned from its backside. Trenches are formed extending through the device wafer and the first electromagnetic radiation blocking layer such that the device wafer is singulated into semiconductor dies. A second electromagnetic radiation blocking layer portion is formed on a backside surface of and sidewalls surfaces of each of the semiconductor dies such that each semiconductor die is fully encapsulated by the first and second electromagnetic radiation blocking layer portions.

In one aspect of the present application, a semiconductor structure is provided. The semiconductor structure includes a semiconductor die, a first dielectric layer portion located on a front side surface of the semiconductor die, and a first electromagnetic radiation blocking layer portion located on the first dielectric layer portion.

In another aspect of the present application, a method of forming semiconductor structure is provided. The method includes forming a plurality of semiconductor dies having a first electromagnetic radiation blocking layer portion formed over a front side of each of the plurality of semiconductor dies. The plurality of semiconductor dies is bonded to a handle substrate through an adhesive layer from the front side of each of the plurality of semiconductor dies. A second electromagnetic radiation blocking layer portion is then formed over a backside surface and sidewall surfaces of each of the plurality of semiconductor dies. Next, the hand substrate and the adhesive layer are removed.

BRIEF DESCRIPTION OF THE DRAWINGS

FIG. 7 is a cross-sectional view of a second exemplary semiconductor structure after forming windows through the first electromagnetic radiation blocking layer according to a second embodiment of the present application.

FIG. 8 is a cross-sectional view of the second exemplary semiconductor structure of FIG. 7 after sequentially forming a second dielectric layer on a patterned first electromagnetic radiation blocking layer and portions of the first dielectric layer exposed by the windows and forming terminal metal contacts contacting the metal pads.

DETAILED DESCRIPTION

Figure 1:
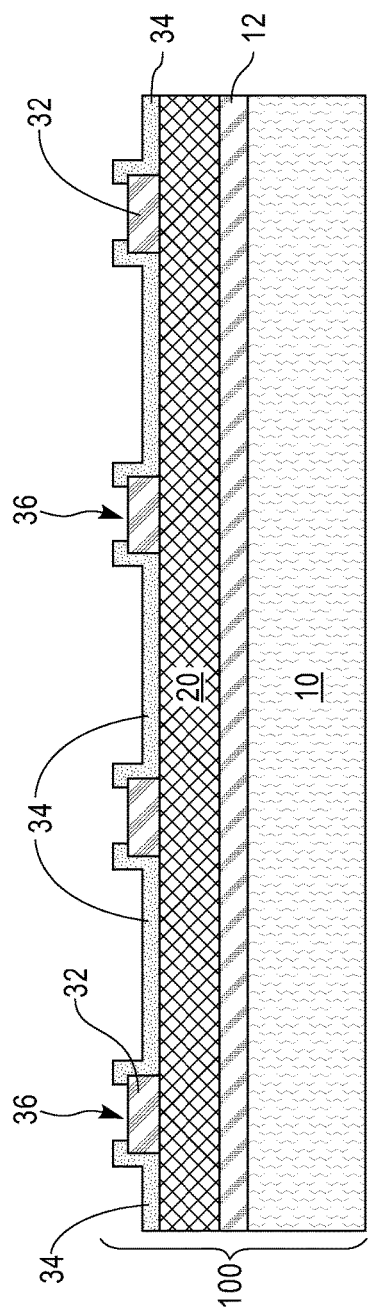
FIG. 1 is a cross-sectional view of a first exemplary semiconductor structure including a device wafer containing a semiconductor substrate, a device layer, an interconnect layer, metal pads and a passivation layer having first openings to expose the metal pads according to a first embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, a first exemplary semiconductor structure according to a first embodiment of the present application includes a device wafer 100 containing a semiconductor substrate 10, a device layer 12, an interconnect layer 20 and a final level contact layer.

The semiconductor substrate 10 may include silicon, germanium, silicon-germanium alloy, silicon-carbon alloy, silicon-germanium-carbon alloy, gallium arsenide, indium arsenide, indium phosphide, and other III-V or II-VI compound semiconductor materials. In some embodiments, the semiconductor substrate 10 may be a single crystalline semiconductor substrate including, for example, single crystalline silicon. The semiconductor substrate 10 may be doped, undoped or contain doped and undoped regions therein. The semiconductor substrate 10 has a thickness that is sufficient to provide mechanical support to the structures formed thereupon. The thickness of the semiconductor substrate 10 is typically from 400 µm to 1,200 µm, although lesser and greater thicknesses can also be employed.

The device layer 12 is supported by the semiconductor substrate 10 and includes various semiconductor devices (not shown) such as transistors, resistors, and capacitors. Such semiconductor devices can be fabricated utilizing techniques that are well known to those skilled in the art.

The interconnect layer 20 includes a dielectric material, which can be a conventional dielectric material such as undoped silicon oxide (undoped silicate glass), doped silicon oxide (doped silicate glass), silicon oxynitride, silicon nitride, or a combination thereof, or can be a low dielectric constant (low-k) material, which refers to a dielectric material having a dielectric constant less than the dielectric constant of silicon oxide, i.e., 3.9. Low-k materials that can be employed in the interconnect layer 20 include organosilicate glass including Si, C, O, H, and optionally N, and methylated-hydrogen silsesquioxane (MSQ). The low dielectric constant material can be deposited by chemical vapor deposition (CVD) or by spin-coating, and can be porous or non-porous. The thickness of the interconnect layer 20 can be from 30 nm to 600 nm, although lesser and greater thicknesses can also be employed.

The interconnect layer 20 also include single or multi-level metal interconnects (not shown) that are electrically connected to the devices in the device layer 12. The metal interconnects may include metal lines, metal vias and/or a combination of metal lines and metal vias vertically abutting the metal lines. The metal vias and metal lines are composed of a conductive material such as Cu, W, or Al, and are formed by methods well known in the art.

The final contact layer includes metal pads 32 disposed over selected areas of the interconnect layer 20 and contacting the metal interconnects (not shown) in the interconnect layer 20. The metal pads 32 can be formed by depositing a conductive layer (not shown) over the interconnect layer 20 and then selectively etching the conductive layer. The metal pads 32 may be formed of any suitable conducive material such as, for example, Cu or Al.

The final contact layer also includes a passivation layer 34 disposed over the interconnect layer 20 and the metal pads 32. The passivation layer 34 may include silicon nitride, silicon oxynitride, silicon carbide, nitrogen and hydrogen doped silicon carbide (SiCNH) or a combination thereof. The passivation layer 34 may be formed by a conformal deposition process such as, for example, CVD or atomic layer deposition (ALD). The thickness of the passivation layer 34 can be from 20 nm to 50 nm, although lesser and greater thicknesses can also be employed.

The passivation layer 34 is lithographically patterned to form first openings 36 extending through the passivation layer 34. The first openings 36 expose top surfaces of the metal pads 32. The first openings 36 can be formed by applying a mask layer (not shown) over the passivation layer 34, and then lithographically patterning the mask layer to form openings therein. Each first opening 36 overlies a portion of one of the metal pads 32. The mask layer can be a photoresist layer or a photoresist layer in conjunction with hardmask layer(s). The pattern in the mask layer is transferred through the passivation layer 34 to form the first openings 36. An anisotropic etch, which can be a dry etch such as reactive ion etch (RIE) or a wet etch, may be performed to remove portions of the passivation layer 32 that are not covered by the patterned mask layer to expose portions of the metal pads 32 within the first openings 36. After forming the first openings 36, the patterned mask layer can be removed by oxygen-based plasma etching.

Figure 2:
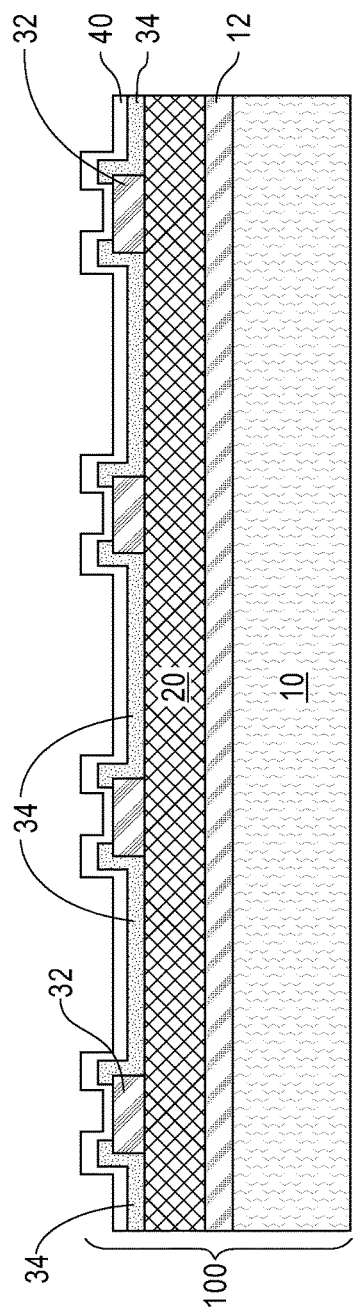
FIG. 2 is a cross-sectional view of the first exemplary semiconductor structure of FIG. 1 after forming a first dielectric layer over the passivation layer and within the first openings.

Referring to FIG. 2, a first dielectric layer 40 is formed on the passivation layer 34 and sidewalls and bottom surfaces of the first openings 36. The first dielectric layer 40 completely covers the top surfaces of the exposed metal pads 32. The first dielectric layer 40 may include silicon nitride or silicon oxide. The first dielectric layer 40 may be formed using conventional deposition processes including, but not limited to, CVD, PECVD or ALD. The thickness of the first dielectric layer 40 can be from 100 nm to 500 nm, although lesser and greater thicknesses can also be employed.

Figure 3:
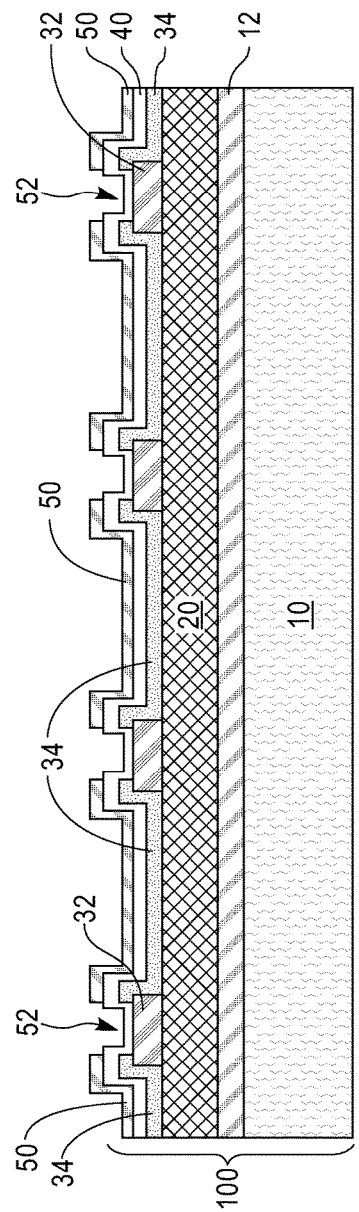
FIG. 3 is a cross-sectional view of the first exemplary semiconductor structure of FIG. 2 after forming a first electromagnetic radiation blocking layer having second openings over the first dielectric layer.

Referring to FIG. 3, a first electromagnetic radiation blocking layer 50 is deposited over the first dielectric layer 40. The first electromagnetic radiation blocking layer 50 blocks any electromagnetic radiation such as UV, IR or visible light that may be incident on the front side (i.e., circuit side) of the semiconductor substrate 10, thus minimizing photo-conduction in the semiconductor substrate 10. The first electromagnetic radiation blocking layer 50 may include any material that has appropriate electromagnetic radiation blocking characteristics, either by absorbing or reflecting the electromagnetic radiation incident thereto. In one embodiment, the first electromagnetic radiation blocking layer 50 includes an opaque metal layer. Exemplary metals that can be employed as the first electromagnetic radiation blocking layer 50 include, but are not limited to, Ti, Ta, Al, Mo, TiW and TiN. In another embodiment, the first electromagnetic radiation blocking layer 50 may include an organic material including a black pigment, or a semiconductor material including amorphous Si, amorphous Ge and amorphous SiGe. The first electromagnetic radiation blocking layer 50 may be formed, for example, by CVD, physical vapor deposition (PVD) or plating. The first electromagnetic radiation blocking layer 50 that is formed may have a thickness from 50 nm to 100 nm, although lesser and greater thicknesses can also be employed. In one embodiment, the first electromagnetic radiation blocking layer 50 includes a Ti layer having a thickness of 80 nm.

The first electromagnetic radiation blocking layer 50 is lithographically patterned to form second openings 52 therein. Each second opening 52 encloses a corresponding one of the first openings 36 and has a width greater than a width of the first openings 36. The second openings 52 thus expose top surfaces of portions of the first dielectric layer 40 that are located around the periphery of the first openings 36. The second openings 52 can be formed by lithography and etching methods, i.e., by applying a mask layer, patterning the mask layer to form openings above the metal pads 32 and transferring the pattern in the mask layer into the first electromagnetic radiation blocking layer 50 by an anisotropic etch. The anisotropic etch can be a dry etch such as, for example RIE or a wet etch that removes the material of the first electromagnetic radiation blocking layer 50 selective to the material of the first dielectric layer 40.

Figure 4:
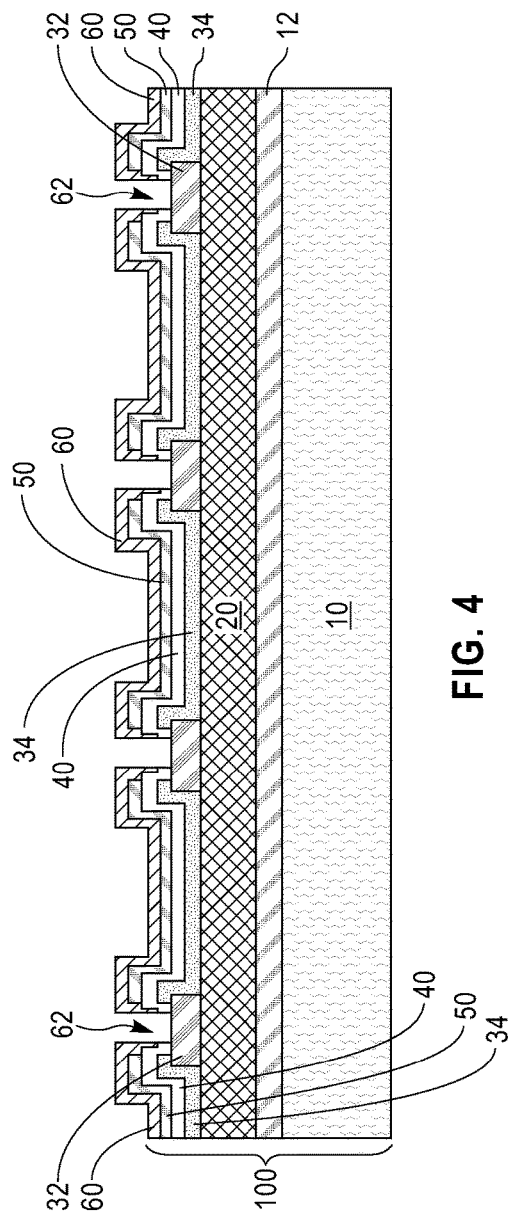
FIG. 4 is across-sectional view of the first exemplary semiconductor structure of FIG. 3 after forming a second dielectric layer on the first electromagnetic radiation blocking layer to fill the second openings, and after forming via openings extending through the second dielectric layer and the first dielectric layer.

Referring to FIG. 4, a second dielectric layer 60 is formed on the first electromagnetic radiation blocking layer 50 and the first dielectric layer 40. The second dielectric layer 60 completely fills the second openings 52. The second dielectric layer 60 may include a dielectric material that is the same as, or different from, the dielectric material that provides the first dielectric layer 40. For example, the second dielectric layer 60 may include silicon nitride or silicon oxide. The second dielectric layer 60 may be formed, for example, by CVD, PVD or ALD. The thickness of the second dielectric layer 60 may be from 100 nm to 500 nm, although lesser and greater thicknesses can also be employed.

A via etching process is subsequently performed to form via openings 62 extending through the second dielectric layer 60 and the first dielectric layer 40 such that a portion of a top surface of each metal pad 32 is exposed by a respective via opening 62. Each via opening 62 is aligned with a corresponding one of the first openings 36 and has a width that is less than the width of the first openings 36. The relatively small dimension of the via openings 62 ensures that the first electromagnetic radiation blocking layer 50 is fully insulated from terminal metal contacts subsequently formed within the via openings 62 in instances where the first electromagnetic radiation blocking 50L is composed of a electrically conductive material. The via openings 62 can be formed by lithography and etching methods described above in formation of the second openings 52. The etch chemistry employed in formation of via openings 62 removes dielectric materials of the second dielectric layer 60 and the first dielectric layer 40 selective to the conductive material of the metal pads 32.

Figure 5:
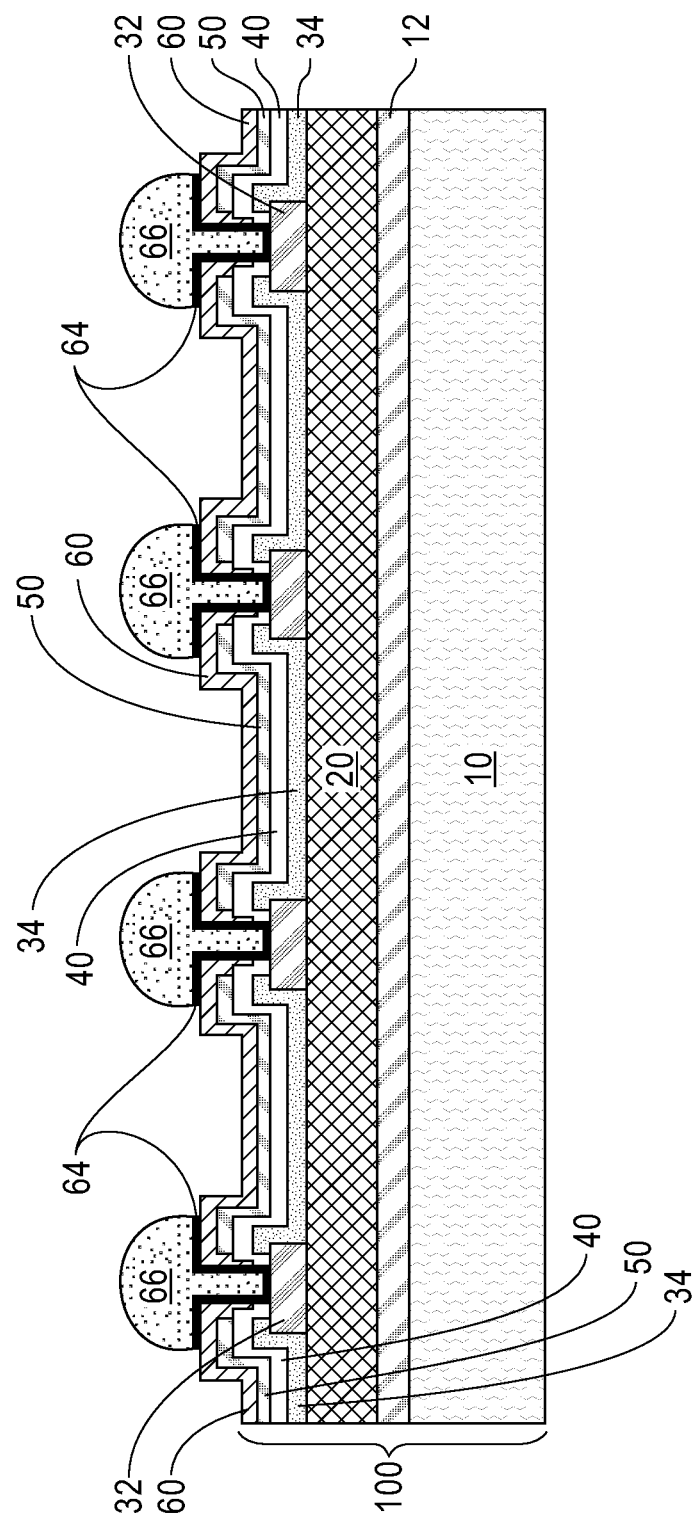
FIG. 5 is a cross-sectional view of the first exemplary semiconductor structure of FIG. 4 after forming terminal metal contacts on portions of the metal pads exposed by the via openings.

Referring to FIG. 5, terminal metal contacts are formed on top of the metal pads 32. Each terminal metal contact includes an under-bump pad 64 present on sidewalls and a bottom surface of one of the via openings 62 and portions of the second dielectric layer 60 around the periphery of one of the via opening 62, and a solder bump 66 over the under-bump pad 64.

The under-bump pads 64 can be formed by depositing a seed layer (not shown) over the sidewalls and bottom surfaces of the via openings 62 and the top surface of the second dielectric layer 60. The seed layer is lithography patterned, for example, by applying, exposing, and developing a photoresist layer (not shown) to form a pattern, followed by an etch that patterns the seed layer to form the under-bump pads 64. The seed layer may include Ni, Cu or an alloy thereof. The seed layer can be formed by PVD or plating. The thickness of the seed layer that is formed may be from 20 nm to 50 nm, although lesser and greater thicknesses can also be employed.

In some embodiments of the present application, and prior to the formation of the seed layer, an adhesion layer (not shown) may be formed to provide good adhesion between the seed layer and the underlying metal pads 32. The adhesion layer may include TiW or Cr—Cu and may be formed by CVD or PVD. The lithographic patterning process employed to etch the seed layer also etches the adhesion layer.

Following the formation of the under-bump pads 64, solder bumps 66 are applied on the under-bump pads 64 using the conventional solder bumping or balling techniques. The solder bumps 66 fill the via openings 62 so as to provide electrical connection to the metal pads 32. The solder bumps 66 may include an alloy such as, for example, Sn—Cu, Sn—Ag or Sn—Pb. Optionally, a solder reflow process may be performed to enhance adhesion between the solder bumps 66 and the under-bump pads 64.

Figure 6:
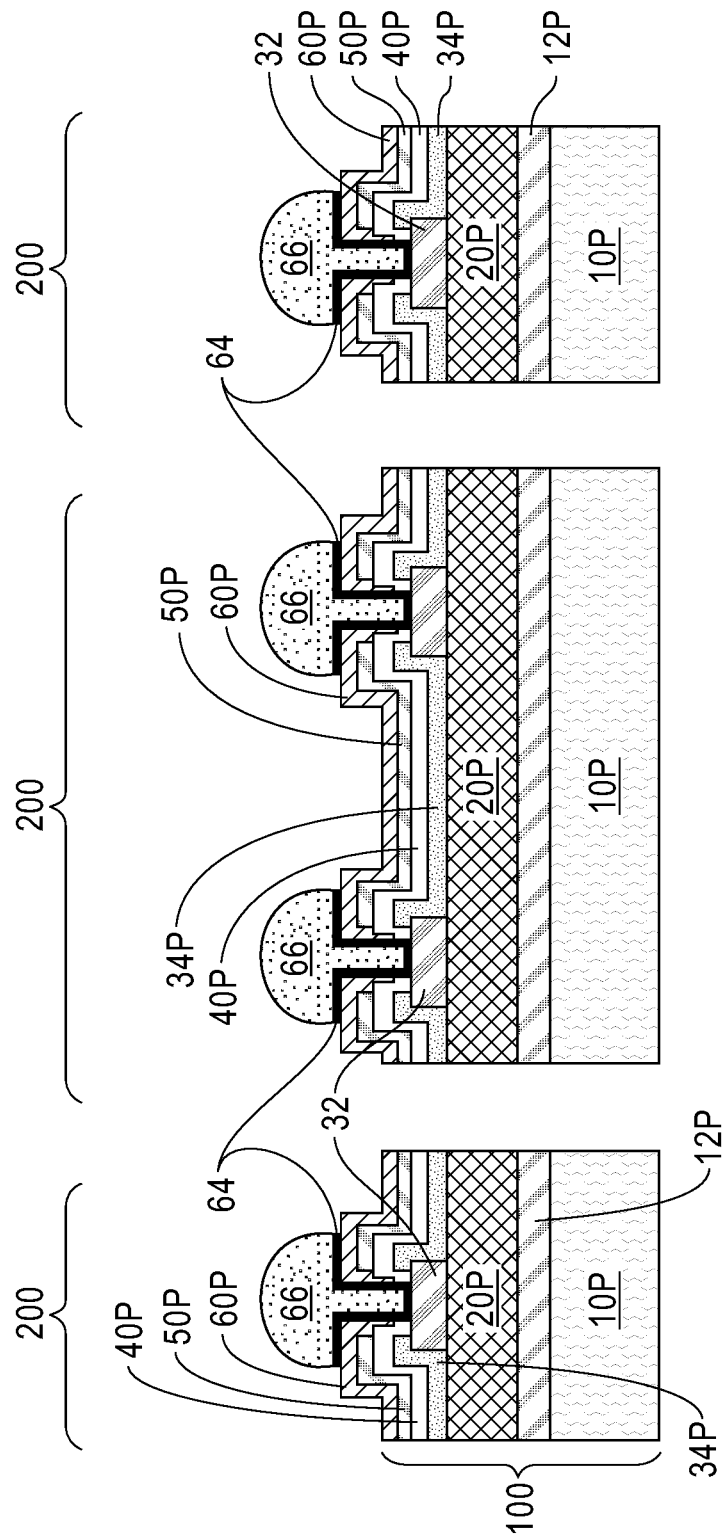
FIG. 6 is a cross-sectional view of the first exemplary semiconductor structure of FIG. 5 after forming semiconductor dies with front side electromagnetic radiation blocking.

Referring to FIG. 6, the device wafer 100 is diced or singulated along dicing streets (not shown) located between active areas of the device wafer 100, and the device wafer 100 is divided into a plurality of semiconductor dies (i.e., semiconductor chips) 200. Each semiconductor die 200 includes a semiconductor substrate portion 10P which is a remaining portion of the semiconductor substrate 10, a device layer portion 12P which is a remaining portion of the device layer 12, an interconnect layer portion 20P which is a remaining portion of the interconnect layer 20, a final level contact layer portion including a passivation layer portion 34P which is a remaining portion of the passivation layer 34 and metal pads 32 embedded in the passivation layer portion 34P. The first dielectric layer 40, the first electromagnetic radiation blocking layer 50 and the second dielectric layer 60 overlying the device wafer 100 are also diced. A stack including a first dielectric layer portion 40P which is a remaining portion of the first dielectric layer 40, a first electromagnetic radiation blocking layer portion 50P which is a remaining portion of the first electromagnetic radiation blocking layer 50 and a second dielectric layer portion 60P which is a remaining portion of the second dielectric layer 60 is thus formed on the front side of each semiconductor die 200. The first electromagnetic radiation blocking layer portion 50P is electrically insulated from the metal pads 32 by the first dielectric layer portion 40P and is electrically isolated from the terminal metal contacts (64, 66) by the second dielectric layer portion 60P. The first electromagnetic radiation blocking layer portion 50P blocks electromagnetic radiation incident on the front side of the semiconductor die 200 from reaching the semiconductor substrate portion 10P. Such front side electromagnetic radiation blocking can effectively reduce photo-conduction in each of the semiconductor dies 200. In some embodiments, the first electromagnetic radiation blocking layer portion 50P can be electrically connected to ground or another node.

Referring to FIG. 7, a second exemplary semiconductor structure according to a second embodiment of the present application is derived from the first exemplary semiconductor structure of FIG. 3 by forming windows 56 through the first electromagnetic radiation blocking layer 50. The windows 56 permit electromagnetic radiation passing through selected semiconductor dies 200 such that electromagnetic radiation can impinge on predetermined sections where optical devices (e.g., optional sensors) are located. The windows 56 can be formed by applying a mask layer over the first electromagnetic radiation blocking layer 50, patterning the mask layer to form openings therein and transferring the pattern in the mask layer into the first electromagnetic radiation blocking layer 50. The mask layer can be a photoresist layer or a photoresist layer in conjunction with a hardmask layer(s). In one embodiment, an anisotropic etch such as RIE can be employed to remove the material of the first electromagnetic radiation blocking layer 50 selective to the dielectric material of the first dielectric material layer 40. A patterned first electromagnetic radiation blocking layer 50A is thus formed after patterning. The patterned mask layer can be subsequently removed by oxygen-based plasma etching.

Referring to FIG. 8, the processing steps of FIGS. 4 and 5 can be sequentially performed to form a second dielectric layer 60 on the patterned first electromagnetic radiation blocking layer 50A and portions of the first dielectric layer 40 exposed by the windows 56 and to form terminal metal contacts (64, 66) contacting the metal pads 32.

Figure 9:
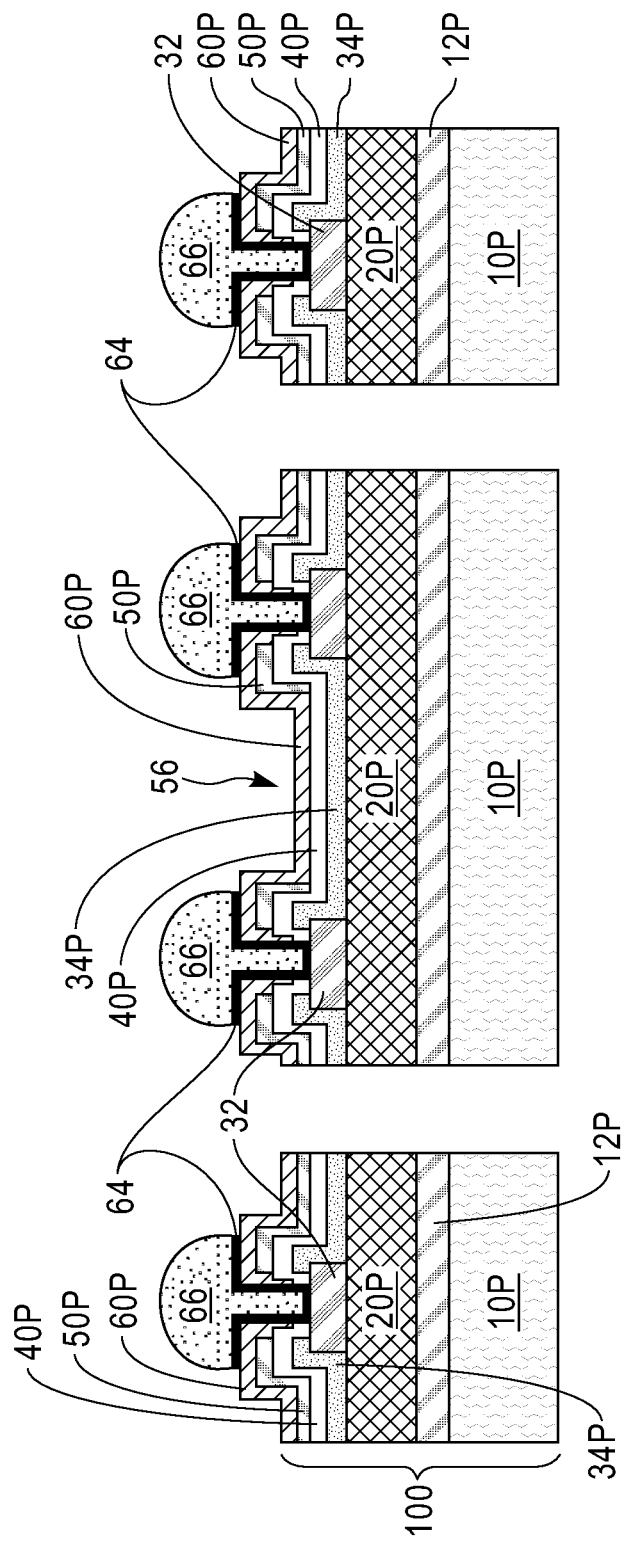
FIG. 9 is a cross-sectional view of the second exemplary semiconductor structure of FIG. 8 after forming semiconductor dies with front side electromagnetic radiation blocking and with front side windows on selected semiconductor dies.

Referring to FIG. 9, the processing steps of FIG. 6 can be performed to dice the device wafer 100, forming a plurality of semiconductor dies 200 with front side electromagnetic radiation blocking. In the second exemplary semiconductor structure, a window 56 may be formed in each of the selected semiconductor dies 200 to allow electromagnetic radiation impinging a predetermined section in one of the selected semiconductor dies 200.

Figure 10:
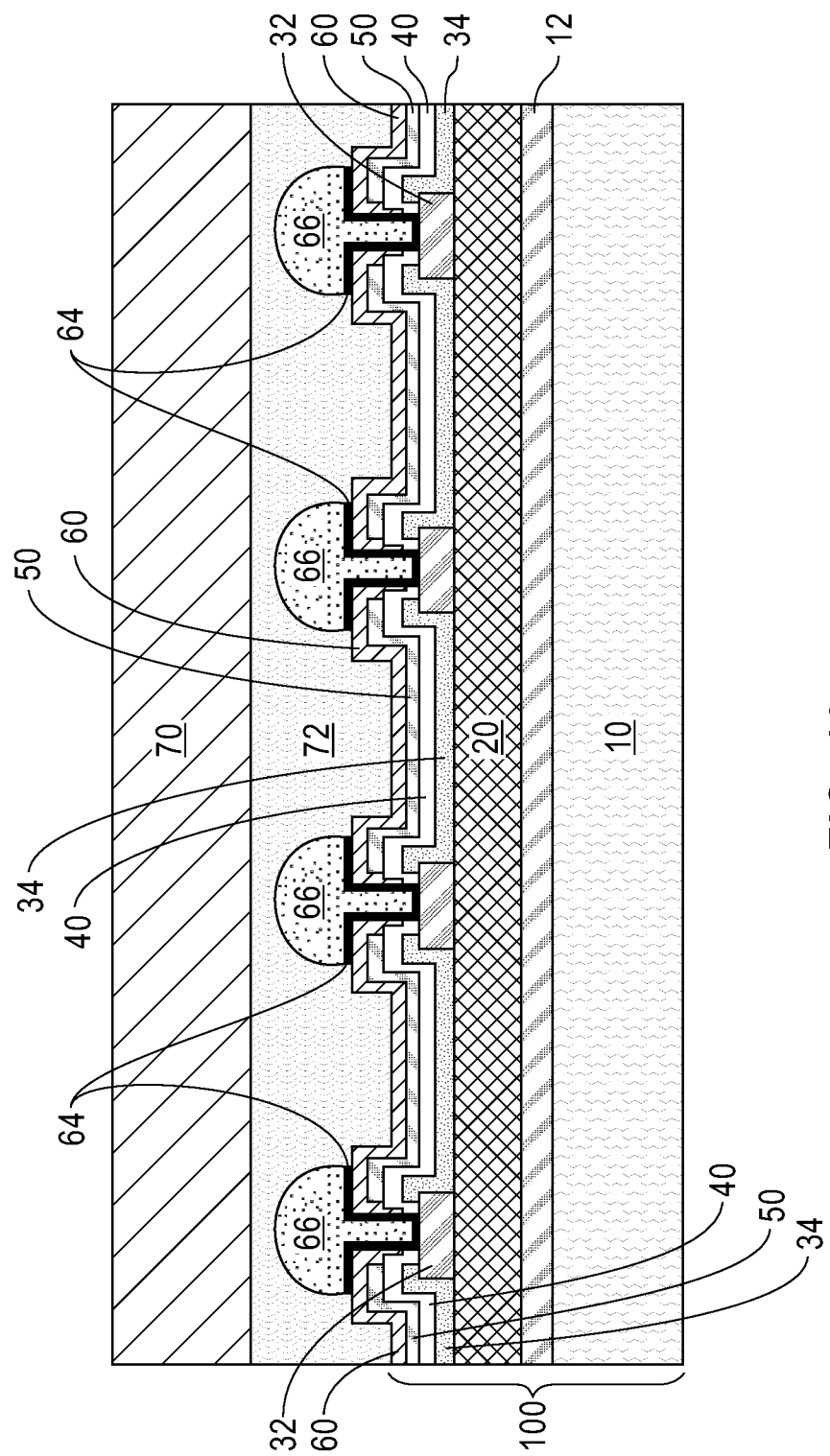
FIG. 10 is a cross-sectional view of a third exemplary semiconductor structure after bonding a handle substrate to an assembly of the device wafer, the first dielectric layer, the first electromagnetic radiation blocking layer, the second dielectric layer and the terminal metal contacts from the front side of the device wafer according to a third embodiment of the present application.

Referring to FIG. 10, a third exemplary semiconductor structure according to a third embodiment of the present application is derived from the first exemplary semiconductor structure of FIG. 5 by bonding a handle substrate 70 to the assembly of the device wafer 100, the first dielectric layer 40, the first electromagnetic radiation blocking layer 50, the second dielectric layer 60 and the terminal metal contacts (64, 66) to the front side of the device wafer 100 through a first adhesive layer 72. The handle substrate 70 provides mechanical support for handling after the subsequent thinning of the semiconductor substrate 10. In one embodiment, the handle substrate 70 can be a glass substrate or a quartz substrate. The handle substrate 70 may have a thickness from 500 µm to about 2000 µm, although lesser and greater thicknesses can also be employed.

The first adhesive layer 72 may be formed of any suitable non-conductive adhesive material including thermosetting polymers, thermoplastic polymers, or dielectric adhesives. Examples of non-conductive adhesive materials include, but are not limited to, benzocyclobutene (BCB), polyarylene ether, polyimide, polymethylmethacrylaete (PMMA) and polydimethylsiloxane (PDMS). In one embodiment, the first adhesive layer 72 is composed of a thermally decomposable adhesive material that breaks down at elevated temperature. The first adhesive layer 72 may be formed as a single contiguous layer, or it may be formed as a plurality of disjoined adhesive material portions. The first adhesive layer 72 can be applied to one or both of surfaces of the device wafer 100 and the handle substrate 70, for example, by spin coating or screen printing. Heat and/or force may then be applied to bond the assembly of the device wafer 100, the first dielectric layer 40, the first electromagnetic radiation blocking layer 50, the second dielectric layer 60 and the terminal metal contacts (64, 66) to the handle substrate 70.

Figure 11:
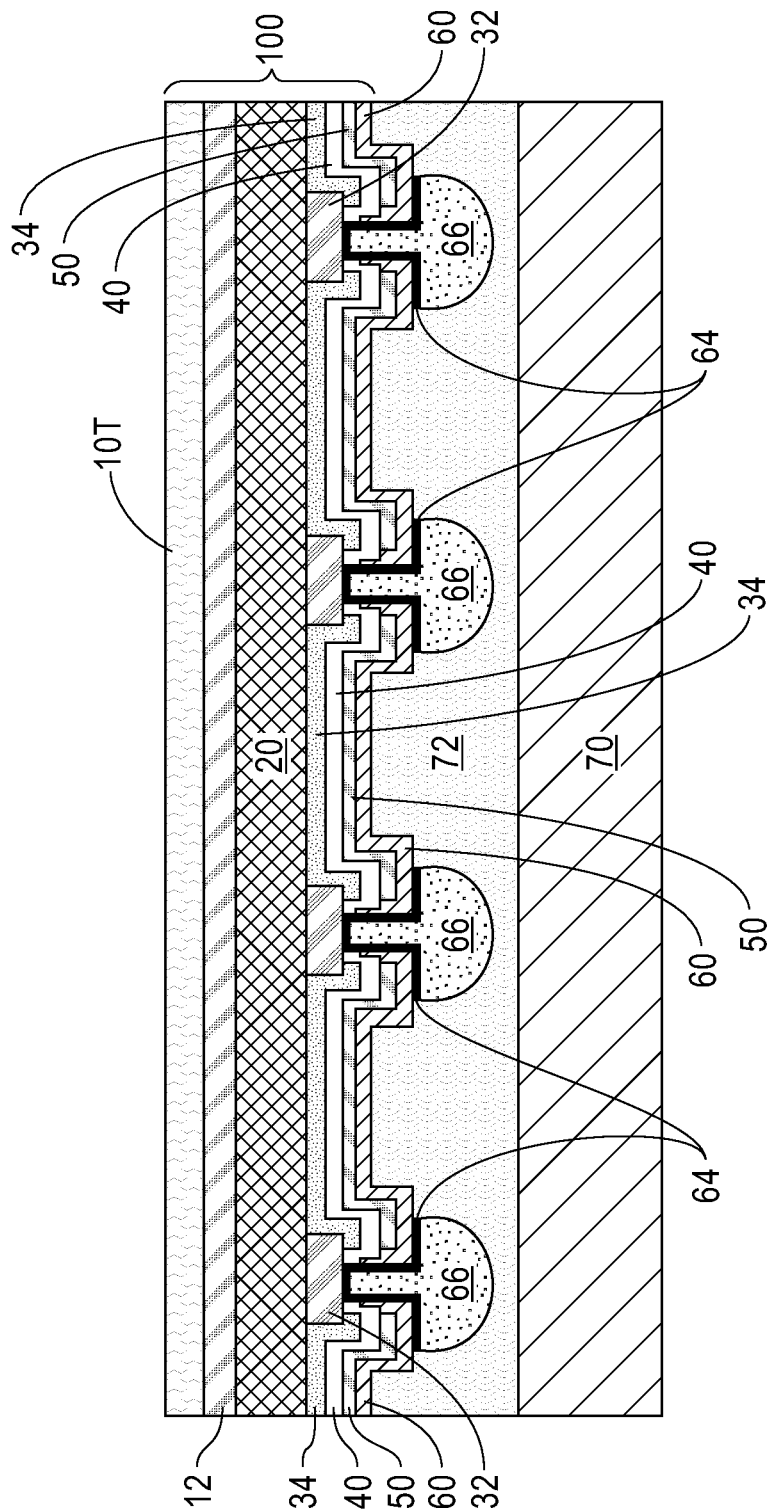
FIG. 11 is a cross-sectional view of the third exemplary semiconductor structure of FIG. 10 after thinning the semiconductor substrate from a backside of the semiconductor substrate to provide a thinned semiconductor substrate.

Referring to FIG. 11, the structure of FIG. 10 is flipped upside down and the semiconductor substrate 10 is thinned by removing a portion of the semiconductor substrate 10 from the backside (i.e., non-circuit side) of the semiconductor substrate 10. Specifically, the backside portion of the semiconductor substrate 10 is removed, for example, by grinding, cleaving, polishing, a recess etch, or a combination thereof. The remaining portion of the semiconductor substrate 10 is herein referred to as a thinned semiconductor substrate 10T. The thickness of the thinned semiconductor substrate 10T can be from 50 µm to 150 µm, although lesser and greater thicknesses can also be employed.

Figure 12:
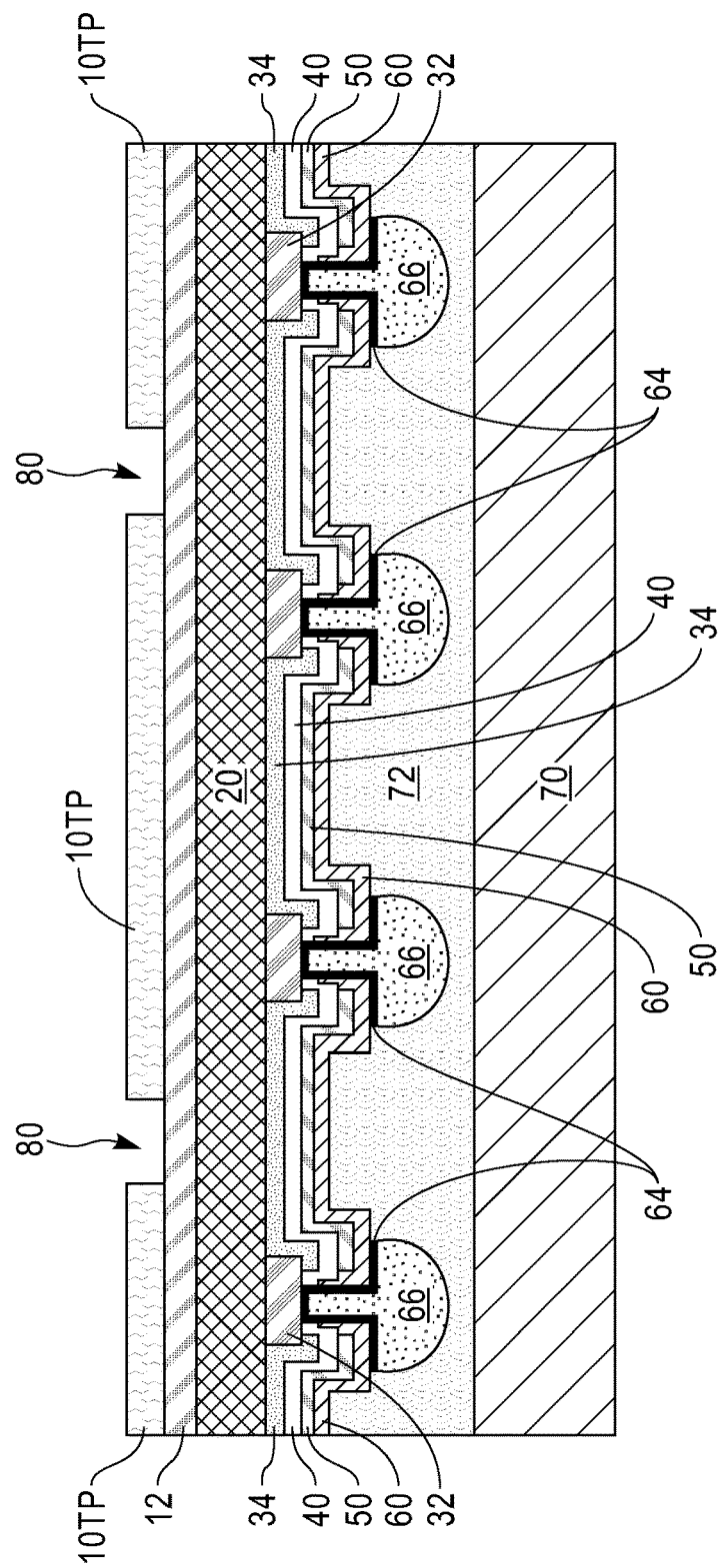
FIG. 12 is a cross-sectional view of the third exemplary semiconductor structure of FIG. 11 after forming trenches extending through the thinned semiconductor substrate.

Referring to FIG. 12, trenches 80 are formed extending through the thinned semiconductor substrate 10T. The trenches 80 are formed in locations corresponding to, and aligned with, the dicing streets between active areas of the device wafer 100. The trenches 80 can be formed by applying a mask layer over the thinned semiconductor substrate 10T, patterning the mask layer to form openings therein and transferring the pattern in the mask layer into the thinned semiconductor substrate 10T. The mask layer can be a photoresist layer or a photoresist layer in conjunction with a hardmask layer(s). In one embodiment, an anisotropic etch such as RIE can be employed to selectively remove the semiconductor material of the thinned semiconductor substrate 10T. Remaining portions of the thinned semiconductor substrate 10T are herein referred to as thinned semiconductor substrate portions 10TP. After forming the trenches 80, the patterned mask layer can be removed by oxygen-based plasma etching.

Figure 13:
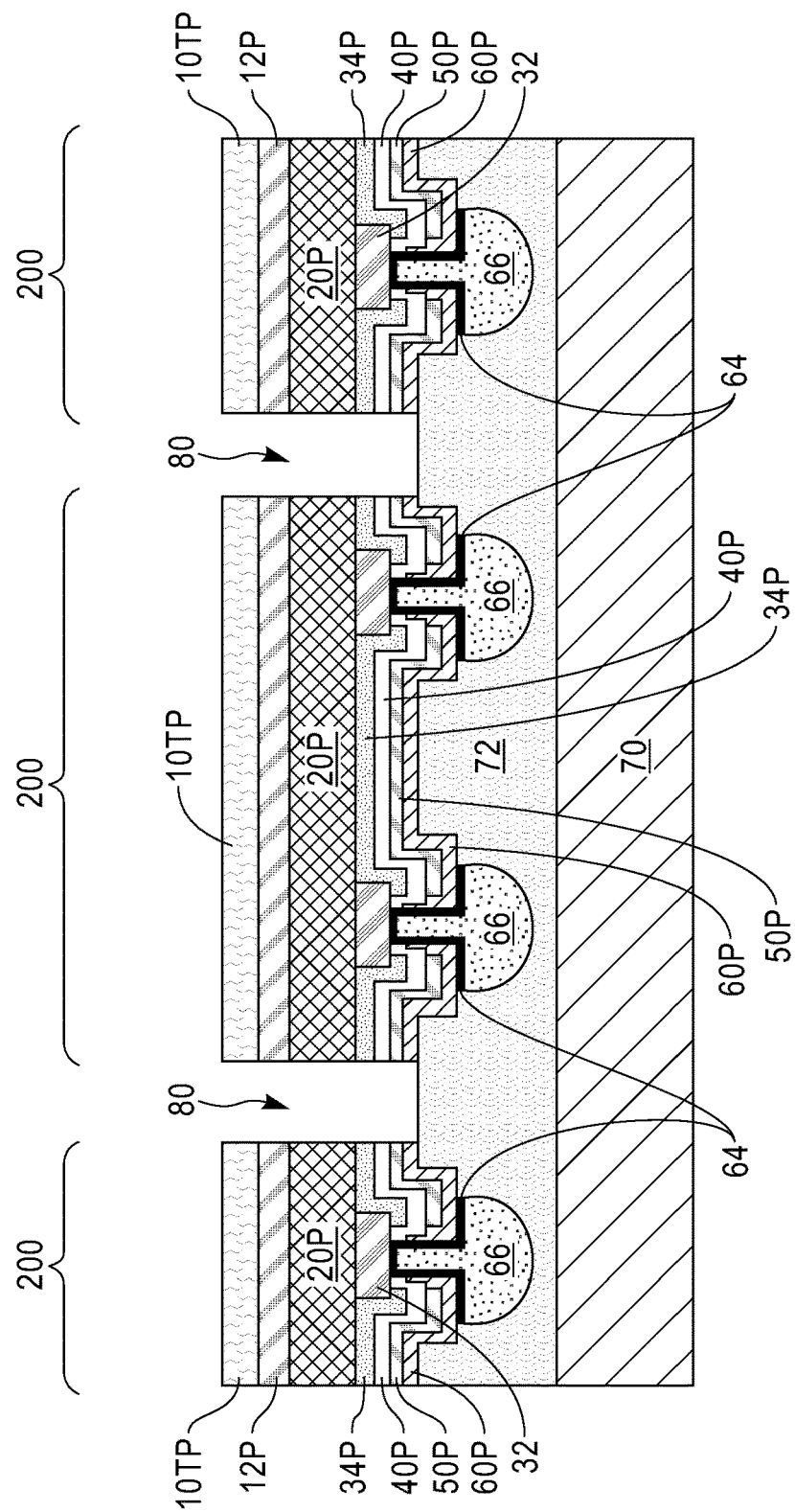
FIG. 13 is a cross-sectional view of the third exemplary semiconductor structure of FIG. 12 after vertically expanding the trenches through the device layer, the interconnect layer, the passivation layer in the device wafer to provide semiconductor dies and through the first dielectric layer, the first electromagnetic radiation blocking layer and the second dielectric layer.

Referring to FIG. 13, the trenches 80 are vertically expanded through the device layer 12, the interconnect layer 20, the passivation layer 34, the first dielectric layer 40, the first electromagnetic radiation blocking layer 50 and the second dielectric layer 60. The vertical expansion of the trenches 80 can be performed by an anisotropic etch which can be a dry etch such as RIE. The device wafer 100 is thus singulated into individual semiconductor dies (i.e., semiconductor chips) 200. Each semiconductor die 200 includes a thinned semiconductor substrate portion 10TP, a device layer portion 12P which is a remaining portion of the device layer 12, an interconnect layer portion 20P which is a remaining portion of the interconnect layer 20, a final level contact layer portion including a passivation layer portion 34P which is a remaining portion of the passivation layer 34 and metal pads 32 embedded in the passivation layer portion 34P. A stack including a first dielectric layer portion 40P which is a remaining portion of the first dielectric layer 40, a first electromagnetic radiation blocking layer portion 50P which is a remaining portion of the first electromagnetic radiation blocking layer 50 and a second dielectric layer portion 60P which is a remaining portion of the second dielectric layer 60 is present on the front side of each semiconductor die 200. The first electromagnetic radiation blocking layer portion 50P is electrically insulated from the metal pads 32 by the first dielectric layer portion 40P and is electrically isolated from the terminal metal contacts (64, 66) by the second dielectric layer portion 60P.

Figure 14:
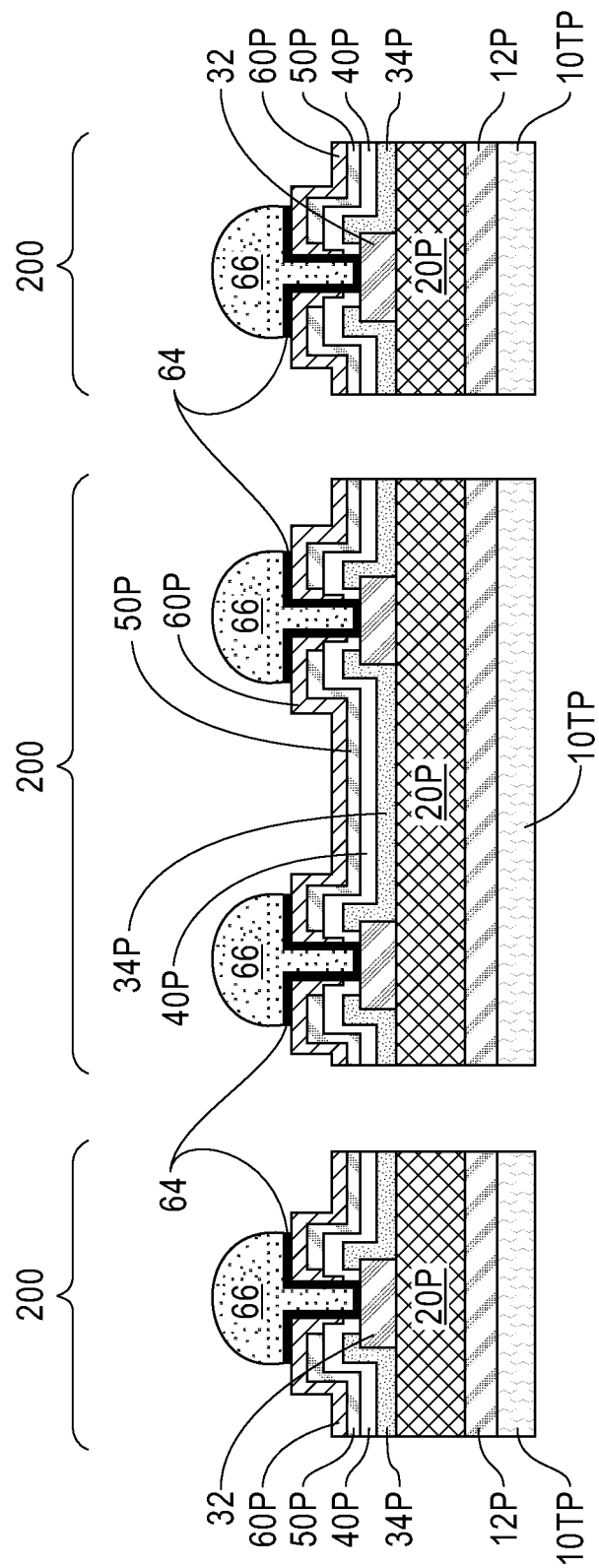
FIG. 14 is a cross-sectional view of the third exemplary semiconductor structure of FIG. 13 after forming thin semiconductor dies with front side electromagnetic radiation blocking.

Referring to FIG. 14, the handle substrate 70 is removed, for example, by cleaving, dissolving or ashing the first adhesive layer 72. After removal of the handle substrate 70, any adhesive material remained on the solder bumps 66, the second dielectric layer portions 60P can be removed by a cleaning process. In one embodiment, the cleaning step may, for example, include a solvent clean. Exemplary solvents that can be employed to remove the residue adhesive material include limonene, acetone, N-methylpyrrolidone (NMP), mesitylene, methyl ethyl ketone ("MEK") or trimethyl benzene. Thinned semiconductor dies 200 with front side electromagnetic radiation blocking are thus formed. Each of the semiconductor dies 200 in the third exemplary semiconductor structure contains a semiconductor substrate portion (i.e., the thinned semiconductor substrate portion 10TP) thinner than that (i.e., the semiconductor substrate portion 10P) of each of the semiconductor dies 200 in the first exemplary semiconductor structure.

Figure 15:
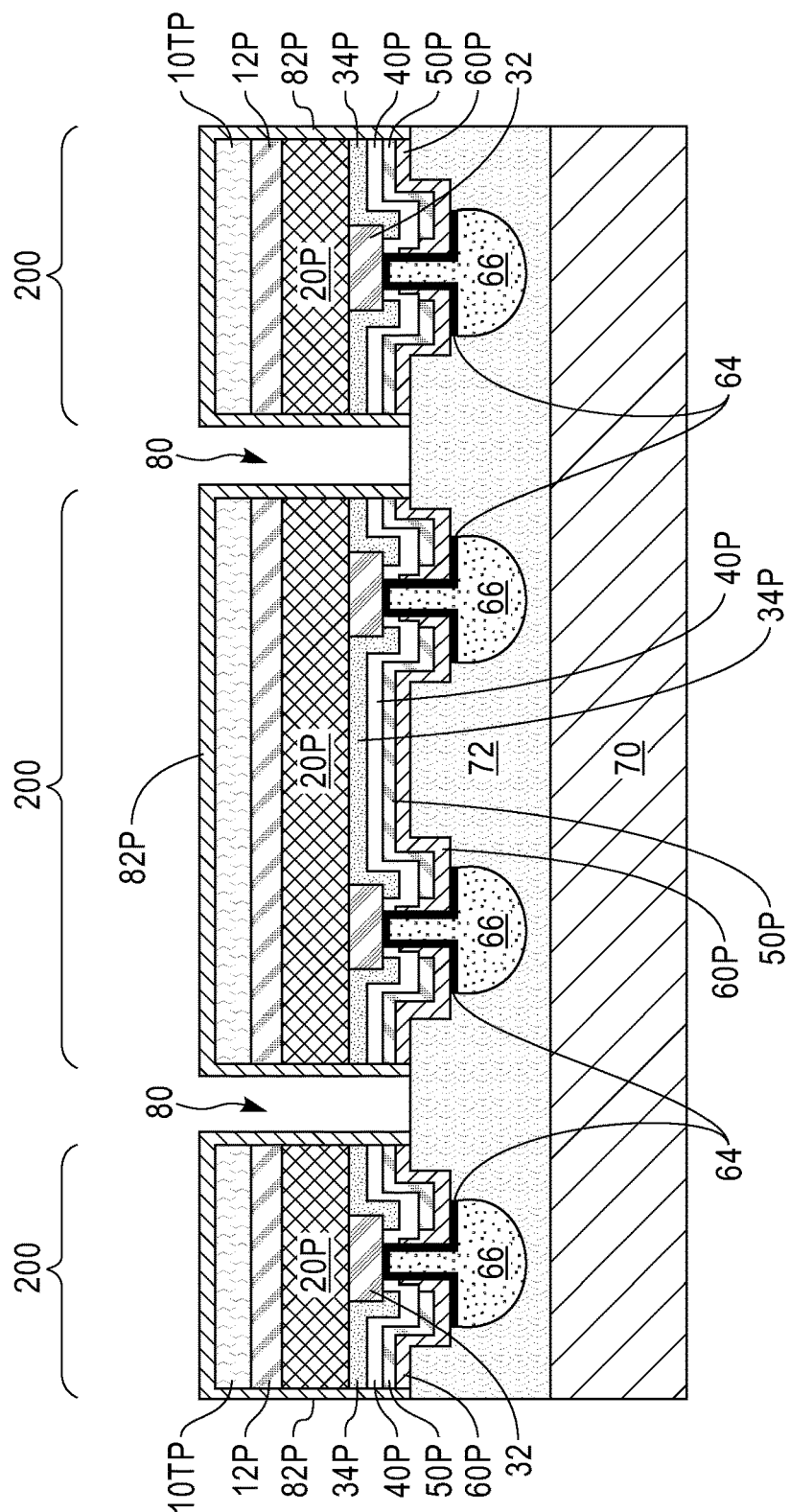
FIG. 15 is a cross-sectional view of a fourth exemplary semiconductor structure after forming a second electromagnetic radiation blocking layer portion on a backside surface and sidewall surfaces of each semiconductor die according to a fourth embodiment of the present application.

Referring to FIG. 15, a fourth exemplary semiconductor structure according to a fourth embodiment of the present application is derived from the third exemplary semiconductor structure of FIG. 13 by forming a second electromagnetic radiation blocking layer (not shown) on sidewalls and bottom surfaces of the trenches 80 and backside surfaces of the thinned semiconductor substrate portions 10TP. The second electromagnetic radiation blocking layer may include an electromagnetic radiation blocking material the same as, or different from, the material providing the first electromagnetic radiation blocking layer 50. For example, the second electromagnetic radiation blocking layer may include an opaque metal layer of Ti, Ta, Al, Mo, TiW or TiN, an organic material including a black pigment, or a semiconductor material including amorphous Si, amorphous Ge and amorphous SiGe. In one embodiment, the second electromagnetic radiation blocking layer includes a Ti layer having a thickness of 80 nm. The second electromagnetic radiation blocking layer may be formed by PVD, CVD or plating.

Portions of the second electromagnetic radiation blocking layer that are present on the bottom surfaces of the trenches 80 are subsequently removed by an anisotropic etch, while portions of the second electromagnetic radiation blocking layer that are present on sidewalls of the trench 80 and on the backside surfaces of the semiconductor substrate portions 10P remain intact. The anisotropic etch can be a dry etch such as RIE or a wet etch. A remaining portion of the second electromagnetic radiation blocking layer present on sidewalls and backside surfaces of each semiconductor die 200 is herein referred to as a second electromagnetic radiation blocking layer portion 82P.

Figure 16:
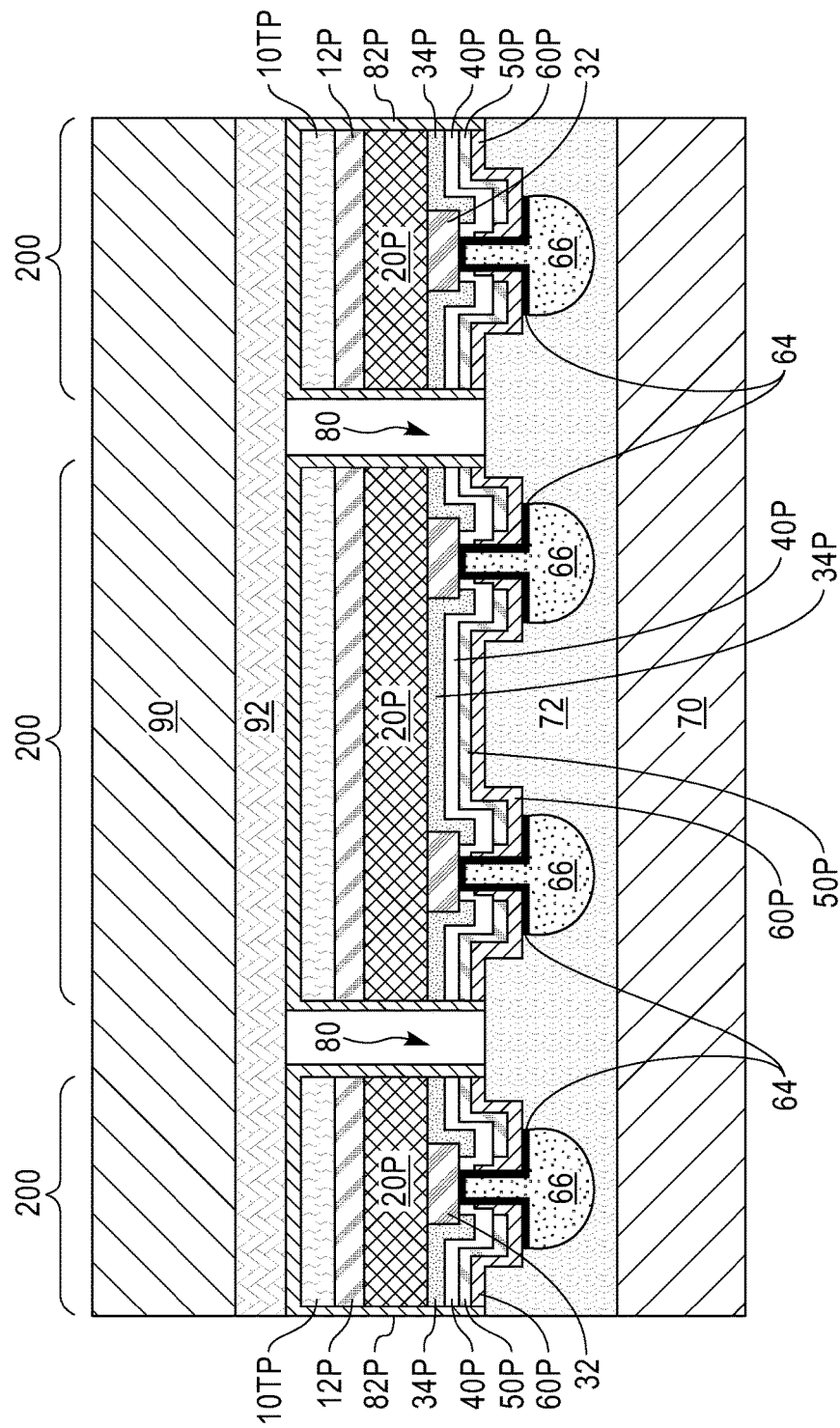
FIG. 16 is a cross-sectional view of the fourth exemplary semiconductor structure of FIG. 15 after bonding a base substrate to backsides of the semiconductor dies through a second adhesive layer.

Referring to FIG. 16, a base substrate 90 is bonded to the backside of the semiconductor dies 200 through a second adhesive layer 92. The base substrate 90 may be a glass substrate or a quartz substrate that provides mechanical support for each semiconductor die 200. The second adhesive layer 92 may include an adhesive material different from the adhesive material employed in the first adhesive layer 72 such that the handle substrate 70 can be selectively removed from the structure once the semiconductor dies 200 are mounted on the base substrate 90. In one embodiment, the second adhesive layer 92 is composed of BCB. The bonding of the base substrate 90 and the assembly of the semiconductor dies 200 and the handle substrate 70 can be performed, for example, by coating the base substrate 90 with an adhesive material, mounting the adhesive-coated base substrate 90 to the assembly of the semiconductor dies 200 and the handle substrate 70 and curing the adhesive material to form the second adhesive layer 92.

Figure 17:
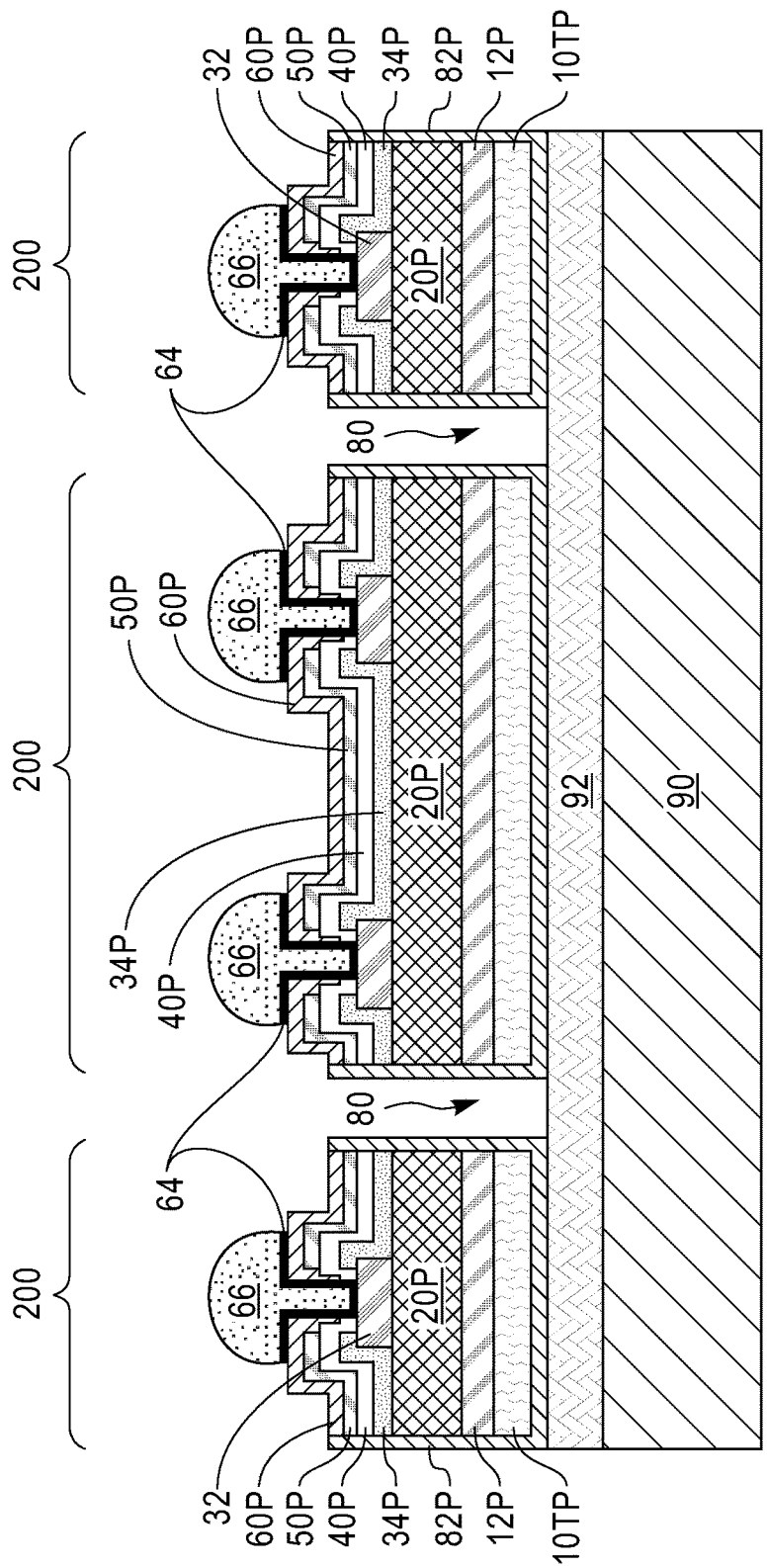
FIG. 17 is a cross-sectional view of the fourth exemplary semiconductor structure of FIG. 16 after removing the handle substrate and the first adhesive layer.

Referring to FIG. 17, the structure of FIG. 16 is flipped over and the handle substrate 70 is separated from the assembly including the semiconductor dies 200 and the base substrate 90, for example, by cleaving, dissolving or ashing the first adhesive layer 72. After removal of the handle substrate 70, any adhesive material remained on the solder bumps 66, the second dielectric layer portions 60P is removed by a cleaning process. In one embodiment, the cleaning step may, for example, include a solvent clean. Exemplary solvents that can be employed to remove the residue adhesive material include limonene, acetone, N-methylpyrrolidone (NMP), mesitylene, methyl ethyl ketone ("MEK") or trimethyl benzene.

Figure 18:
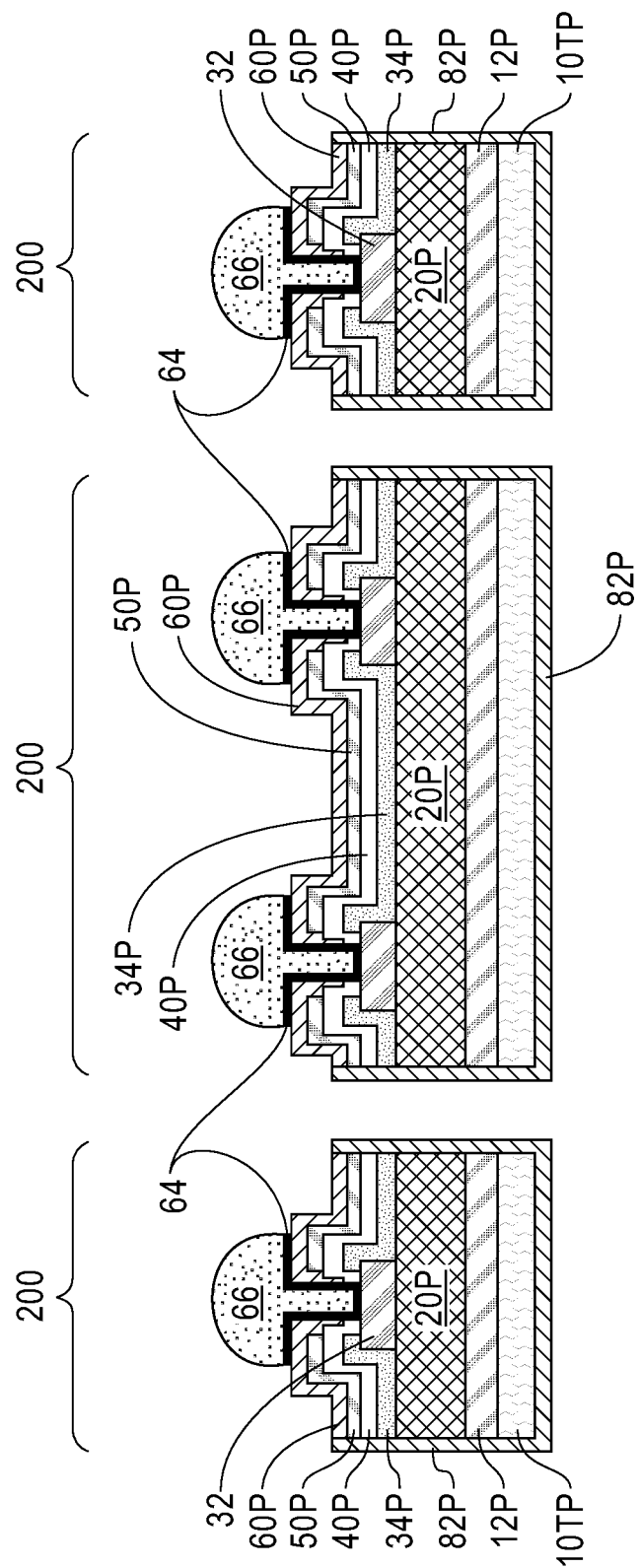
FIG. 18 is a cross-sectional view of the fourth exemplary semiconductor structure of FIG. 17 after removing the base substrate and the second adhesive layer to provide semiconductor dies with fully electromagnetic radiation blocking.

Referring to FIG. 18, the base substrate 90 is removed, for example, by cleaving, dissolving or ashing the second adhesive layer 92. After the removal of the base substrate 90, a plurality of semiconductor dies 200 thus formed. In some embodiments, the second electromagnetic radiation blocking layer portion 82P can be electrically connected to ground or another node.

In the fourth embodiment of the present application, since the first electromagnetic radiation blocking layer portion 50P is located over the front side of each semiconductor die 200 and the second electromagnetic radiation blocking layer portion 82P is located on the sidewall and backside surfaces of each semiconductor die 200, each entire semiconductor die 200 is wrapped around by the electromagnetic radiation blocking components, i.e., the first electromagnetic radiation blocking layer portion 50P and the second electromagnetic radiation blocking layer portion 82P. The fully encapsulation of each semiconductor die 200 by the electromagnetic radiation blocking components 50P, 82P can minimize the photo-conduction in the art since no electromagnetic radiation can enter into the thinned semiconductor substrate portion 10TP when the semiconductor dies 200 are illuminated. These electromagnetic radiation blocking components 50P, 82P add only a negligible amount to the total die dimension, thus are suitable for profile-sensitive applications.

Figure 19:
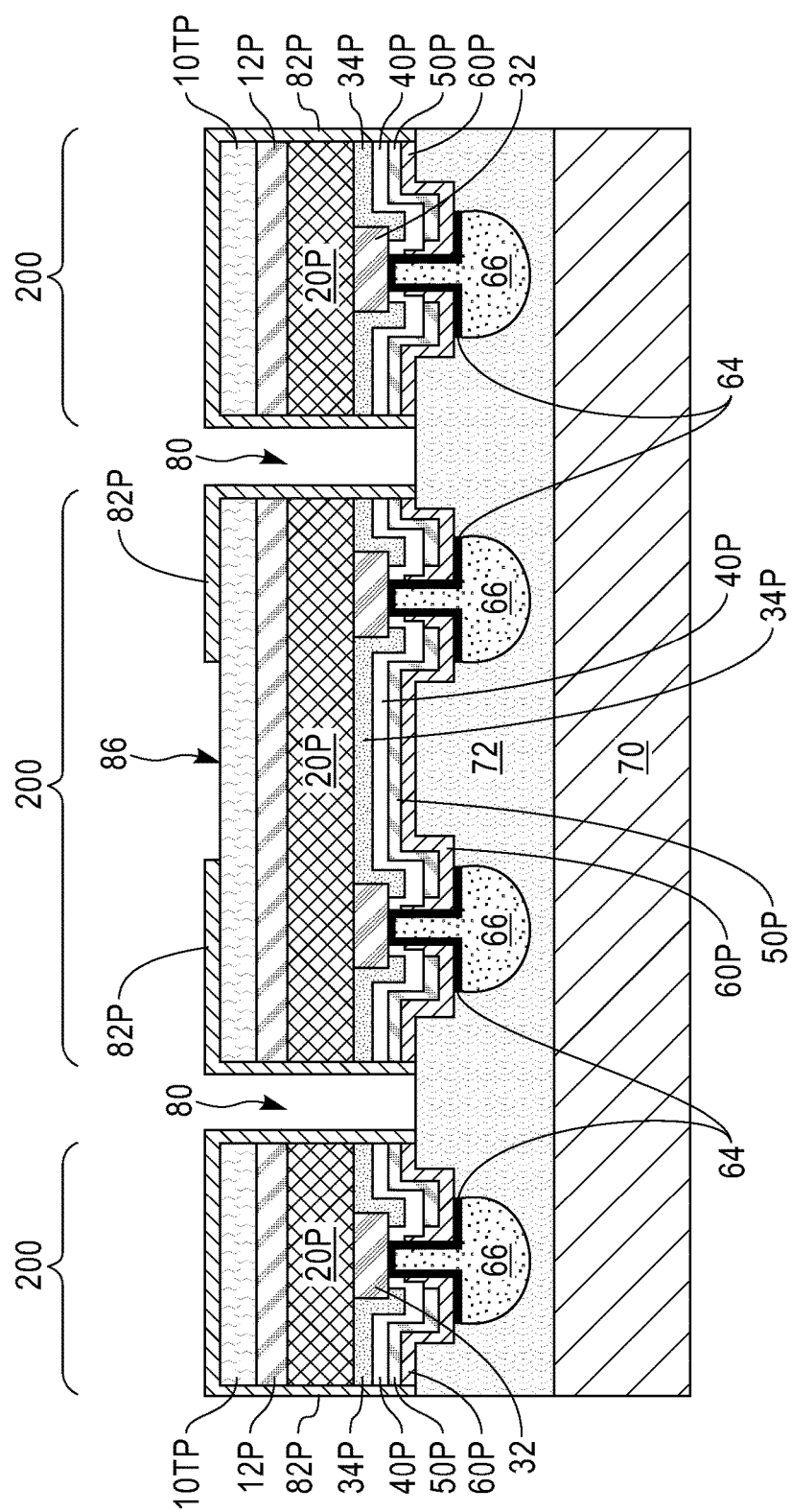
FIG. 19 is a cross-sectional view of a fifth exemplary semiconductor structure after forming windows in the second electromagnetic radiation blocking layer portions on the backside surfaces of the semiconductor dies according to a fifth embodiment of the present application.

Referring to FIG. 19, a fifth exemplary semiconductor structure according to a fifth embodiment of the present application is derived from the fourth exemplary semiconductor structure of FIG. 15 by forming a window 86 through the second electromagnetic radiation blocking layer portion 82P in each of selected semiconductor dies 200 where transmission of electromagnetic radiation is desired. The windows 86 can be formed by performing processing steps of FIG. 7.

Figure 20:
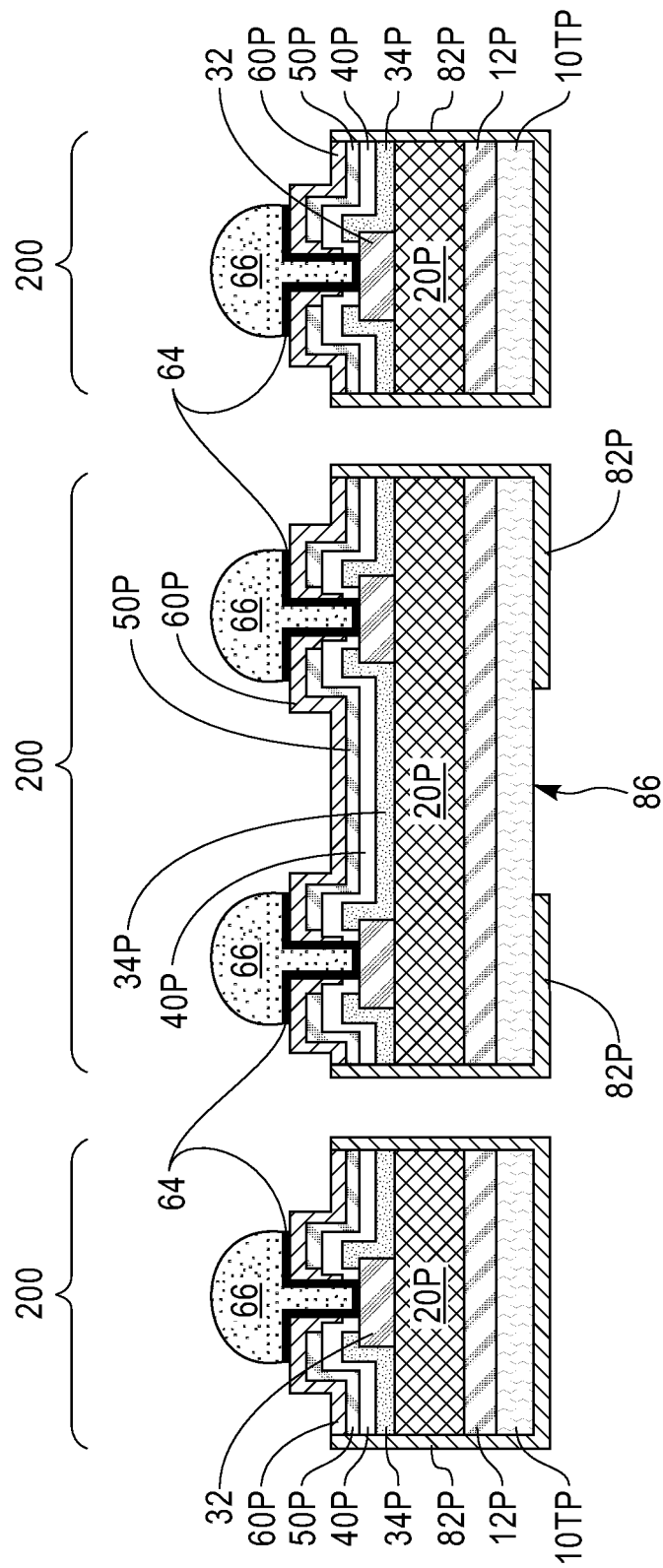
FIG. 20 is a cross-sectional view of the fifth exemplary semiconductor structure of FIG. 19 after forming semiconductor dies with fully electromagnetic radiation blocking and with back side windows on selected semiconductor dies.

Referring to FIG. 20, the processing steps of FIGS. 16-18 can be sequentially performed to form a plurality of free-standing semiconductor dies 200. In the fifth embodiment of the present application, a window 86 is formed in the second electromagnetic radiation blocking layer portion 82P located on the backside of each of the selected semiconductor dies 200 to allow electromagnetic radiation impinging on predetermined section within each of the selected semiconductor dies 200 from backside.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a semiconductor die comprising a stack of, from bottom to top, a semiconductor substrate portion, a device layer portion, an interconnect layer portion and a final level contact layer portion, wherein the final level contact layer portion comprises metal pads located entirely on a topmost surface of the interconnect layer portion and entirely embedded in a passivation layer portion, wherein the passivation layer portion directly contacts sidewall surfaces of each of the metal pads and extends onto a portion of a topmost surface of each of the metal pads;
   a first dielectric layer portion located on a front side surface of the semiconductor die and in direct physical contact with the passivation layer and another portion of the topmost surface of each of the metal pads; and
   a first electromagnetic radiation blocking layer portion located on the first dielectric layer portion.

2. The semiconductor structure of claim 1, further comprising terminal metal contacts electrically connected to a remaining portion of the topmost surface of each of the metal pads.

3. The semiconductor structure of claim 2, further comprising a second dielectric layer portion located on the electromagnetic radiation blocking layer portion, wherein the second dielectric layer portion laterally surrounds the terminal metal contacts and electrically insulates the first electromagnetic radiation blocking layer portion from the terminal metal contacts.

4. The semiconductor structure of claim 1, wherein the first electromagnetic radiation blocking layer portion is located over an entirety of the first dielectric layer portion.

5. The semiconductor structure of claim 3, wherein the first electromagnetic radiation blocking layer portion is located over a portion of the first dielectric layer portion, wherein the second dielectric layer portion is in direct contact with the first electromagnetic radiation blocking layer portion and another portion of the first dielectric layer portion that is not covered by the first electromagnetic radiation blocking layer portion.

6. The semiconductor structure of claim 1, further comprising a second electromagnetic radiation blocking layer portion located on a backside surface and sidewall surfaces of the semiconductor die, wherein backside surface constitutes a surface of the semiconductor substrate opposite a surface of the semiconductor substrate including the semiconductor device layer.

7. The semiconductor structure of claim 6, wherein the second electromagnetic radiation blocking layer portion is located over an entirety of the backside surface of the semiconductor die.

8. The semiconductor structure of claim 6, wherein the second electromagnetic radiation blocking layer portion is located over a portion of the backside surface of the semiconductor die.

9. The semiconductor structure of claim 1, wherein the electromagnetic radiation blocking layer portion comprises an opaque metal.

10. The semiconductor structure of claim 1, wherein the electromagnetic radiation blocking layer portion comprises an organic material.

11. The semiconductor structure of claim 1, wherein the electromagnetic radiation blocking layer portion comprises a semiconductor material.

* * * * *